(12) United States Patent
Rosa

(10) Patent No.: US 7,139,195 B2
(45) Date of Patent: Nov. 21, 2006

(54) EEPROM MEMORY COMPRISING A NON-VOLATILE REGISTER INTEGRATED INTO THE MEMORY ARRAY THEREOF

(75) Inventor: Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 36 days.

(21) Appl. No.: 11/067,345

(22) Filed: Feb. 25, 2005

(65) Prior Publication Data

US 2005/0201158 A1 Sep. 15, 2005

Related U.S. Application Data

(63) Continuation of application No. PCT/FR2003/002559, filed on Aug. 21, 2003.

(30) Foreign Application Priority Data

Aug. 27, 2002 (FR) .................................. 02 10611

(51) Int. Cl.
*G11C 11/34* (2006.01)
(52) U.S. Cl. .............................. 365/185.1; 365/185.23; 365/218
(58) Field of Classification Search ............. 365/185.1, 365/185.23, 218, 51, 63, 104
See application file for complete search history.

(56) References Cited

U.S. PATENT DOCUMENTS

| | | | |
|---|---|---|---|
| 4,788,663 A | 11/1988 | Tanaka et al. ............... | 365/185 |
| 4,912,534 A | 3/1990 | Tanaka et al. .............. | 357/23.5 |
| 5,177,705 A * | 1/1993 | McElroy et al. ........ | 365/185.06 |
| 5,187,683 A * | 2/1993 | Gill et al. .............. | 365/185.06 |
| 5,862,091 A | 1/1999 | Bion et al. .................. | 365/207 |

FOREIGN PATENT DOCUMENTS

| | | |
|---|---|---|
| EP | 0085550 | 8/1983 |
| EP | 0443775 | 8/1991 |
| EP | 0778581 | 6/1997 |
| EP | 1085521 | 3/2001 |

OTHER PUBLICATIONS

Cioaca et al., A Million-Cycle CMOS 256K EEPROM, IEEE Journal of Solid-State Circuits, IEEE Inc., New York, US, vol. 22, No. 5, Oct. 1987, pp. 684-692.
Gupta et al., 5V-Only EEPROM—Springboard for Autoprogrammable Systems, Electronics, vol. 55, No. 3, Feb. 10, 1982, pp. 121-125, VNU Business Publications, New York, US.

* cited by examiner

*Primary Examiner*—Anh Phung
*Assistant Examiner*—Dang Nguyen
(74) *Attorney, Agent, or Firm*—Lisa K. Jorgenson; Allen, Dyer, Doppelt, Milbrath & Gilchrist, P.A.

(57) ABSTRACT

An electrically erasable and programmable memory includes a memory array and a non-volatile register integrated with the memory array. The memory array includes normal memory cells arranged in rows and columns. Normal bit lines are coupled to the columns of the normal memory cells, and word lines are coupled to the rows of the normal memory cells. The non-volatile register includes at least one memory point. Each memory point includes at least one normal memory cell coupled to one of the normal bit lines. Each normal memory cell includes a floating-gate transistor having a floating gate and a tunnel window associated with the floating gate. A selection transistor is coupled to the floating-gate transistor. Each memory point further includes at least one special memory cell including a floating-gate transistor having a floating gate coupled to the floating gate of the normal memory cell. The special memory cell is devoid of a tunnel window. A special bit line is coupled to the special memory cell so that the memory point can be read.

24 Claims, 5 Drawing Sheets

EEPROM MEMORY COMPRISING A NON-VOLATILE REGISTER INTEGRATED INTO THE MEMORY ARRAY THEREOF

RELATED APPLICATION

The present application is a continuation of International Application No. PCT/FR2003/002559 filed on Aug. 21, 2003, the entire disclosure of which is incorporated herein by reference.

FIELD OF THE INVENTION

The present invention relates to electronic devices, and more particularly, to an electrically erasable and programmable memory (EEPROM) integrated onto a silicon substrate along with a non-volatile register.

BACKGROUND OF THE INVENTION

Non-volatile memory cells are frequently used to store special bits of an integrated circuit, such as configuration bits, status bits, redundant program bits (memory redundancy programming), protection bits of a memory array, etc. These special bits are generally arranged in a non-volatile register. The content of the register is read in priority by a specific read circuit. The content is transferred into a dynamic register as soon as the supply voltage is applied to the integrated circuit, or before the performance of the first operation by the integrated circuit. For example, the first operation may be a response to a Start command applied to the integrated circuit.

A non-volatile register comprises one or more non-volatile memory elements. Each memory element enables a special bit to be stored. A specific read circuit is associated with each memory element so that the bit stored in the memory can be read to be transferred into the dynamic register. A differential read is generally provided to reduce the non-volatile register read time.

FIG. 1 represents an example embodiment of a memory element NVME1 of a non-volatile register, as well as an example embodiment of a circuit SA1 for reading the memory element. The memory element NVME1 is a differential type and comprises two memory points M11, M12. Each memory point M11, M12 comprises a selection input E0, a gate control input E1, a program input E2, a read input E3 and a source node SLC.

The read circuit SA1 comprises, for example, two inverter gates I1, I2 supplied by a voltage Vcc, which is generally the supply voltage of the integrated circuit in which the assembly is arranged. The gates I1, I2 are head-to-tail connected and form an inverter latch or flip-flop. The input of the gate I1 is linked to the read input E3 of the memory point M11 through a cascode transistor TN1. The input of the gate I2 is linked to the read input E3 of the memory point M12 through a cascode transistor TN2. The output OUT of the read circuit SA1 is taken off at the output of one of the gates I1, I2. In this case, the output is the output of the gate I1.

The memory points M11, M12 are generally configured before the integrated circuit is marketed. Such as, for example, during the test phase prior to marketing the integrated circuit. This configuration involves putting the memory points M11, M12 into complementary states. One memory point is erased and the other memory point is programmed, or vice-versa, depending on the data to be saved in the memory element NVME1.

If the memory point M11 is programmed and the memory point M12 is erased, the memory point M11 is electrically conductive between its read input E3 and the node SLC, while the memory point M12 is not conductive. Thus, when the voltage Vcc appears, the input of the inverter gate I1 (output of the gate I2) is pulled to 0 (ground) and the output OUT changes to 1 (Vcc).

Conversely, if the memory point M12 is programmed and the memory point M11 is erased, the input of the inverter gate I2 (output of the gate I1) is pulled to 0 (ground) and the output OUT changes to 0 when the voltage Vcc appears.

FIG. 2 represents a memory point M1 structure that can be used to produce each of the memory points M11, M12. The memory point M1 comprises a first floating-gate transistor FGT1 for erasing and programming the memory point, and at least a second floating-gate transistor FGT2 for reading the memory point. Each floating-gate transistor is equipped with a selection transistor such that the memory point comprises two selection transistors ST1, ST2. Each floating-gate transistor and its selection transistor form an EEPROM memory cell, respectively C1, C2.

The floating-gate transistors FGT1, FGT2 have their control gates connected to the gate control input E1. The selection transistors ST1, ST2 have their gates connected to the selection input E0. The drain of the transistor FGT1 is linked to the program input E2 through the selection transistor ST1, while its source is linked to the node SLC. The drain of the transistor FGT2 is linked to the read input E3 through the selection transistor ST2, while its source is linked to the node SLC. The node SLC is generally a source line SL.

The floating gates of the transistors FGT1, FGT2 are inter-connected and each comprise a tunnel window TW. The tunnel window corresponds to a region in which the oxide layer between the floating gate and the silicon substrate is very thin (a few atomic layers) so as to enable the removal or injection of charges into the floating gate by the tunnel effect (Fowler Nordheim effect).

The operations of erasing and programming the memory point M1 involve removing or injecting electrical charges into the floating gates of the transistors FGT1, FGT2 by the tunnel effect. This removal or injection is applied to the transistor FGT1 only, through the inputs E0, E1, E2. For this purpose, a high voltage Vpp on the order of 8 to 15 V (depending on the field of technology) is applied to the transistor FGT1 according to an erase or program method to be chosen from the various methods known to those skilled in the art. Since the transistor FGT2 has its floating gate connected to the floating gate of the transistor FGT1, the removal or the injection of electrical charges into the floating gate of the transistor FGT1 is transmitted to the floating gate of the transistor FGT2.

The memory point M1 is read by the transistor FGT2. A read voltage Vread is applied to the control gate of the transistor FGT2 through the input E1. This voltage is, for example, equal to 0 (ground), since a programmed transistor generally has a negative threshold voltage and an erased transistor has a positive threshold voltage. Simultaneously, the voltage Vcc is applied to the selection input E0 so that the selection transistor ST2 is on.

The cascode transistors TN1, TN2 (FIG. 1) receive a bias voltage Vcasc equal to VD+Vt at their gate, with Vt being the threshold voltage of the transistors TN1, TN2. Thus, the voltage received by the drain of the transistor FGT2 during the reading of the memory point is equal to VD. The voltage VD is controlled due to the cascode transistors to avoid the transistor FGT2 being spuriously programmed by a drain stress effect when the transistor is in the erased state. The spurious programming of the transistor FGT2 leads to the spurious programming of the transistor FGT1.

The voltage VD must not generally exceed 1 volt, i.e., a voltage Vcasc on the order of 2 volts. The data read at the input E3 depends on the programmed or erased state of the transistor FGT2, the latter being off in the erased state (data corresponding to a logic 1) or on in the programmed state (data corresponding by convention to a logic 0).

One principle of the present invention is to integrate a non-volatile register memory element into an EEPROM memory. The EEPROM comprising a memory array, a line decoder, a column decoder, and a read circuit. The memory array comprises normal bit lines and normal memory cells linked to the normal bit lines. Each normal memory cell comprises a floating-gate transistor comprising a tunnel window and a selection transistor.

However, such a memory element for a non-volatile register has various disadvantages. A first disadvantage of the memory element is that it requires control of the drain voltage VD of the floating-gate transistors, which requires providing the cascode transistors and the bias circuit delivering the voltage Vcasc. The bias circuit delivers the voltage Vcasc as soon as the supply voltage Vcc appears to enable the memory element to be rapidly read before the integrated circuit effectively starts up. Whether it is a simple voltage dividing bridge or a more complex bias circuit, such as a charge pump, the bias circuit has the disadvantage of consuming current. It also takes a certain amount of time to start up, such that the memory element cannot be read instantly when the supply voltage appears.

Another disadvantage of the memory element is that the reading thereof requires the application of the voltage Vcc to the selection input E0 of each memory point M11, M12 so that the selection transistor ST2 is on. A selection circuit for selecting the memory points M11, M12 must therefore be provided to transfer the data contained in the memory element to a dynamic register.

Another disadvantage of the memory element is that the reading thereof requires the application of the read voltage Vread to the gate control input E1. If the voltage Vread is zero as indicated above, a circuit for connecting the input E1 to ground should intervene when the data contained in the memory element is transferred to a dynamic register. As a result of all of these disadvantages, the memory element cannot easily be integrated into an EEPROM memory array.

SUMMARY OF THE INVENTION

In view of the foregoing background, an object of the present invention is to provide a non-volatile register memory element which does not require control of the drain voltage of its floating-gate transistors, and which does not require any cascode transistors or any bias circuit for biasing the cascode transistors, which is fast to read and which can easily be integrated into an EEPROM memory array.

Another object of the present invention is to enable a non-volatile register memory element to be integrated into a memory array. In other words, the object is to provide a EEPROM memory comprising a non-volatile register memory element integrated into the memory array of the EEPROM memory.

These and other objects are achieved by providing an electrically erasable and programmable memory integrated onto a silicon substrate comprising a memory array, a line decoder, a column decoder, and a read circuit. The memory array may comprise normal bit lines and normal memory cells linked to the normal bit lines. Each normal memory cell may comprise a floating-gate transistor comprising a tunnel window, and a selection transistor.

The memory array may comprise at least one memory point of a non-volatile register, comprising a normal memory cell and a special memory cell. The normal memory cell is linked to a normal bit line of the memory array and is erase and program accessible through the decoders of the memory array. The special memory cell may comprise a floating-gate transistor devoid of any tunnel window. The floating gate of the floating-gate transistor of the special memory cell may be connected to the floating gate of the floating-gate transistor of the normal memory cell. A special bit line links the special memory cell of the memory point to a specific circuit for reading the memory point.

According to one embodiment, the special memory cell may comprise a selection transistor having its source and drain short-circuited.

According to one embodiment, the selection transistor may comprise a doped region forming a short-circuit between the source and drain.

According to one embodiment, the memory may comprise two memory points each comprising a normal memory cell and a special memory cell, with each special memory cell being linked to a special bit line.

According to one embodiment, the memory may comprise two memory points each comprising two redundant normal memory cells and two redundant special memory cells. Each redundant special memory cell may be linked to a special bit line. The two memory points may form a memory element of a non-volatile register integrated into the memory array, and is program accessible through the decoders of the memory array and is read accessible without going through the decoders of the memory array due to the special bit lines.

According to one embodiment, the two memory points may be implanted into a dedicated area of the memory array, situated on the edge of the memory array. The edge of the memory array may also comprise dummy memory cells.

According to one embodiment, the memory may comprise a circuit for differentially reading the two memory points, linked to the special bit lines.

According to one embodiment, the memory may comprise a circuit for inhibiting the differential read circuit during periods of erasing and programming the memory points, and a circuit for storing, during the inhibition of the reading, data read in the memory points before the inhibition of the reading.

According to one embodiment, the differential read circuit may comprise an inverter latch with two inputs. Each input of the latch may be linked to a memory point through an isolation transistor.

According to one embodiment, the differential read circuit may comprise two conducting branches each comprising a PMOS transistor, the drain of which is linked to one of the memory points. A first logic gate may be linked at input to one of the conducting branches. At least a second logic gate may form, with the first logic gate, a volatile-type latch during periods of erasing or programming the memory points.

The present invention also relates to a method for manufacturing on a silicon substrate a memory point of a non-volatile register, in which the memory point is manufactured at the same time as an EEPROM memory array so that the memory point is integrated into the memory array. The memory array may comprise normal bit lines and normal memory cells linked to the normal bit lines. Each normal memory cell may comprise a floating-gate transistor comprising a tunnel window, and a selection-transistor. The method may comprise manufacturing a first floating-gate transistor comprising a tunnel window, provided for programming and erasing the memory point. A selection transistor may be manufactured for selecting the first floating-gate transistor. A second floating-gate transistor may be manufactured without a tunnel window, and is provided for reading the memory point. The floating gates of the two floating-gate transistors are interconnected. A special bit line links the second transistor to the reading circuit without going through decoders of the memory array.

According to one embodiment, the method may comprise manufacturing a transistor for selecting the second floating-gate transistor, and implanting a doped region causing a short-circuit of the source and drain of the transistor for selecting the second floating-gate transistor.

According to one embodiment, the method may comprise manufacturing two memory points each comprising a normal memory cell and a special memory cell. Each special memory cell may be linked to a special bit line. The two memory points may form a memory element of a non-volatile register integrated into the memory array.

According to one embodiment, the method may comprise manufacturing two memory points each comprising two redundant normal memory cells and two redundant special memory cells. Each redundant special memory cell may be linked to a special bit line. The two memory points may form a memory element of a non-volatile register integrated into the memory array.

According to one embodiment, the two memory points may be implanted into a dedicated area of the memory array. The dedicated area may be situated on the edge of the memory array, near dummy memory cells of the memory array.

BRIEF DESCRIPTION OF THE DRAWINGS

These and other objects, features and advantages of the present invention will be explained in greater detail in the following description of a memory point according to the present invention and of various embodiments of memory elements according to the present invention, given in relation with, but not limited to the following figures.

DETAILED DESCRIPTION OF THE PREFERRED EMBODIMENTS

Figure 3:
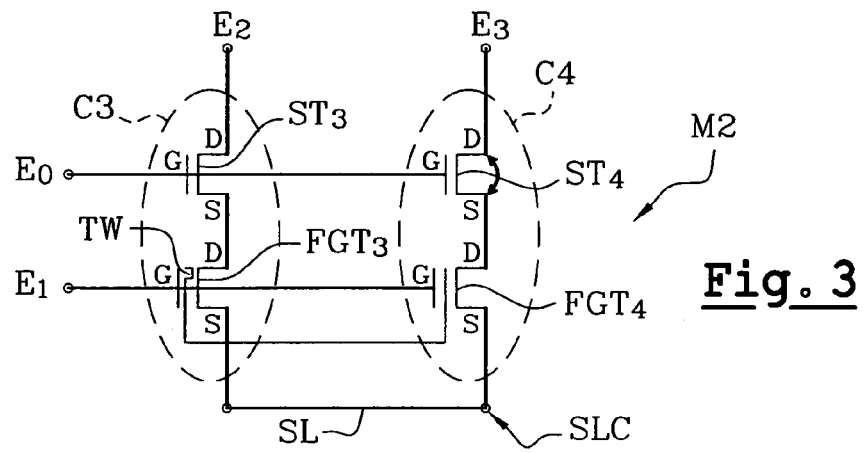
FIG. 3 represents a memory point according to the present invention.

FIG. 3 represents a memory point M2 structure according to the present invention, used to produce non-volatile register memory elements. The memory point M2 has an architecture comprising a floating-gate transistor FGT3 for erasing and programming the memory point, and at least one floating-gate transistor FGT4 for reading the memory point. Each floating-gate transistor is linked to a selection transistor, such that the memory point comprises two selection transistors ST3, ST4. Each floating-gate transistor and its selection transistor form an EEPROM memory cell, respectively C3, C4.

The floating-gate transistors FGT3, FGT4 have their control gates connected to a gate control input E1 of the memory point M2. Their floating gates are interconnected. The selection transistors ST3, ST4 have their gates connected to a selection input E0 of the cell. The drain of the transistor FGT3 is linked to a program input E2 of the cell through the selection transistor ST3, while its source is linked to a source node SLC or source line SL. The drain of the transistor FGT4 is linked to a read input E3 of the cell through the selection transistor ST4, while its source is linked to the source line SL.

Several transistors FGT4, FGT4', FGT4" can be arranged in parallel if it is necessary to drain substantial current to rapidly pull to zero the input of a read circuit having a high input capacitance. The floating gate of the transistor FGT3 comprises a tunnel window TW while the floating gate of the transistor FGT4 does not comprise a tunnel window.

The operations of erasing and programming the memory point M2 involve removing or injecting electrical charges into the floating gates, by the tunnel effect, by acting on the transistor FGT3. Since the transistor FGT4 has its floating gate connected to the floating gate of the transistor FGT3, the removal or the injection of electrical charges into the transistor FGT3 is transmitted to the floating gate of the transistor FGT4. For that purpose, a high voltage Vpp on the order of 8 to 15 V is applied to the transistor FGT3, as indicated in TABLE 1 below.

Figure 1:
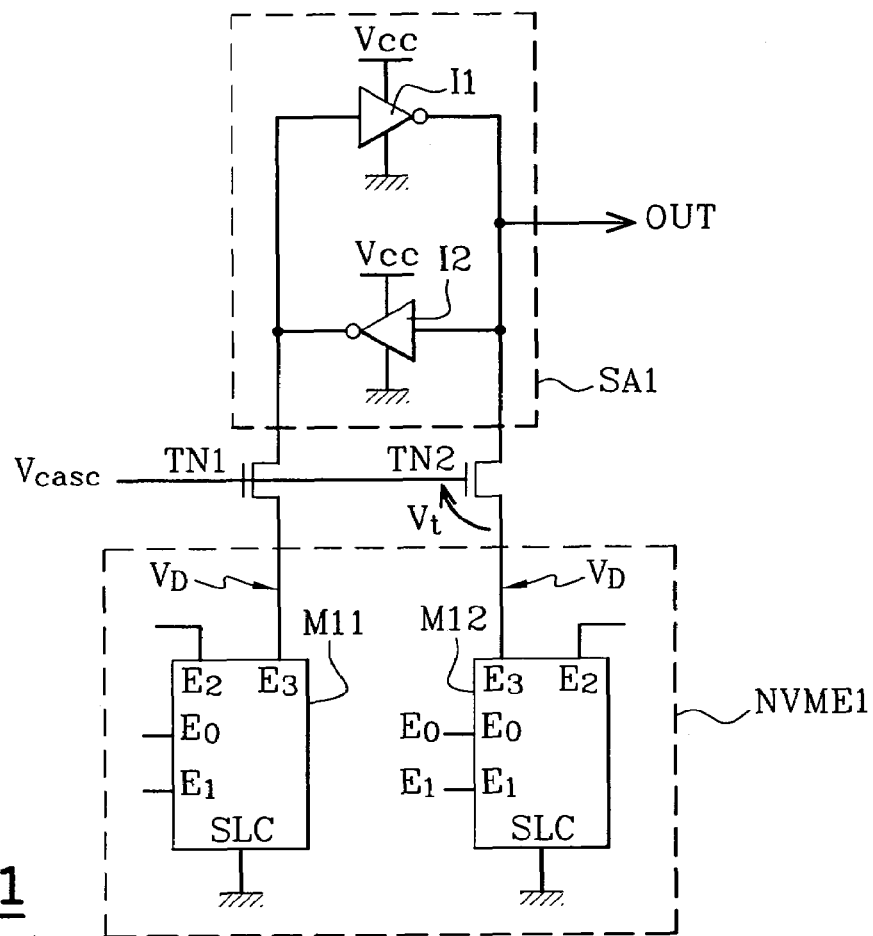
FIG. 1 represents a memory element according to the prior art.
Figure 2:
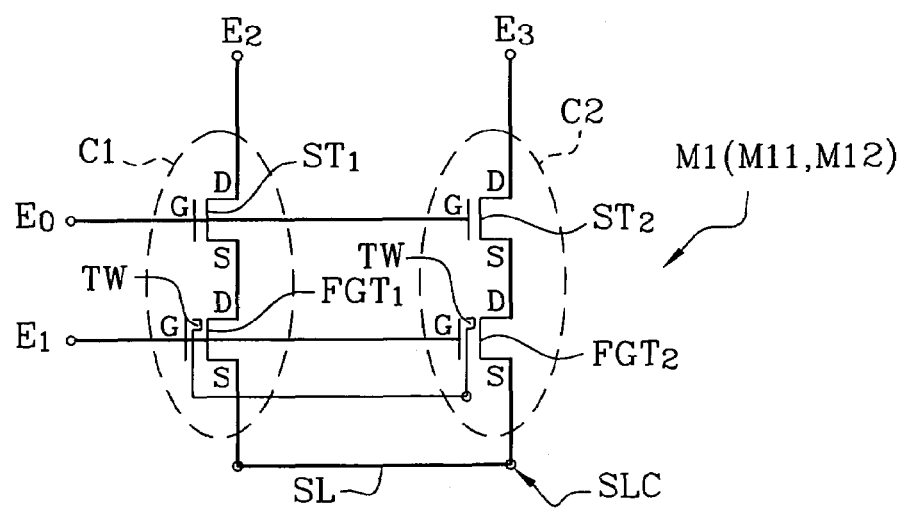
FIG. 2 represents a memory point in the memory element in FIG. 1.

The reading of the memory point is also described by TABLE 1. This reading is performed on the transistor FGT4 through the input E3. The main advantage of the memory point M2 is that the transistor FGT4, devoid of any tunnel window, is not sensitive to the drain stress. In a classical floating-gate transistor comprising a tunnel window, the drain stress causes a slow removal of negative electrical charges (electrons) trapped in the floating gate when the transistor is in the erased state. Here, this involuntary removal of electrical charges cannot occur, even in the presence of a high drain voltage, since the transistor FGT4 does not have a tunnel window. It is also not necessary to control the drain voltage VD applied to the transistor FGT4 during the reading of the memory point. It is not necessary to provide the cascode transistors TN1, TN2 represented in FIG. 1 or the bias circuit delivering the voltage Vcasc.

TABLE 1

| Operation | Input | | | | SL |
|---|---|---|---|---|---|
| | E0 | E1 | E2 | E3 | |
| Erase | FLT or GND | Vpp | FLT | FLT | GND |
| Program | Vpp | GND | Vpp | FLT | FLT |
| Read | Vcc (or GND or FLT) | Vread (or GND or FLT) | FLT | 1 or 0 | GND |

E0: selection input,
E1: gate control input,
E2: program input,
E3: read input,
SL: source line SL,
GND: ground,
FLT: Floating potential,
Vcc: supply voltage of the integrated circuit, and
Vread: read voltage.

According to an optional aspect of the present invention, by performing a differential read of the two memory points M11, M12, it is no longer necessary to apply the read voltage Vread to the gate control input E1, such that the input E1 can be grounded or left floating as indicated in TABLE 1. Indeed, the random voltage appearing at a control gate left floating cannot become lower than 0.6 V due to the existence of a stray diode between the control gate and the substrate. Since a programmed transistor has a negative threshold voltage generally below −1 V and an erased transistor has a positive threshold voltage, the fluctuations in the floating voltage at the input E1 do not affect the differential read process.

According to another aspect of the present invention, the selection transistor ST4 is removed or has a short-circuit between its drain and source, as represented by an arrow in FIG. 3. The removal or the short-circuiting of the transistor ST4 then makes it possible to read the memory point M2 without the need to apply a selection signal to the selection input E0. In these conditions, the input E0 can be grounded or left floating as indicated in TABLE 1, instead of receiving the voltage Vcc.

Figure 4B:
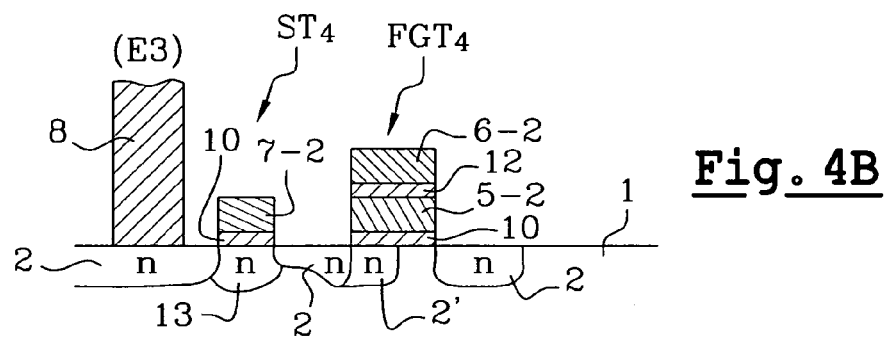
FIG. 4B is a cross-section of the memory point taken along axis AA' in FIG. 4A.
Figure 4A:
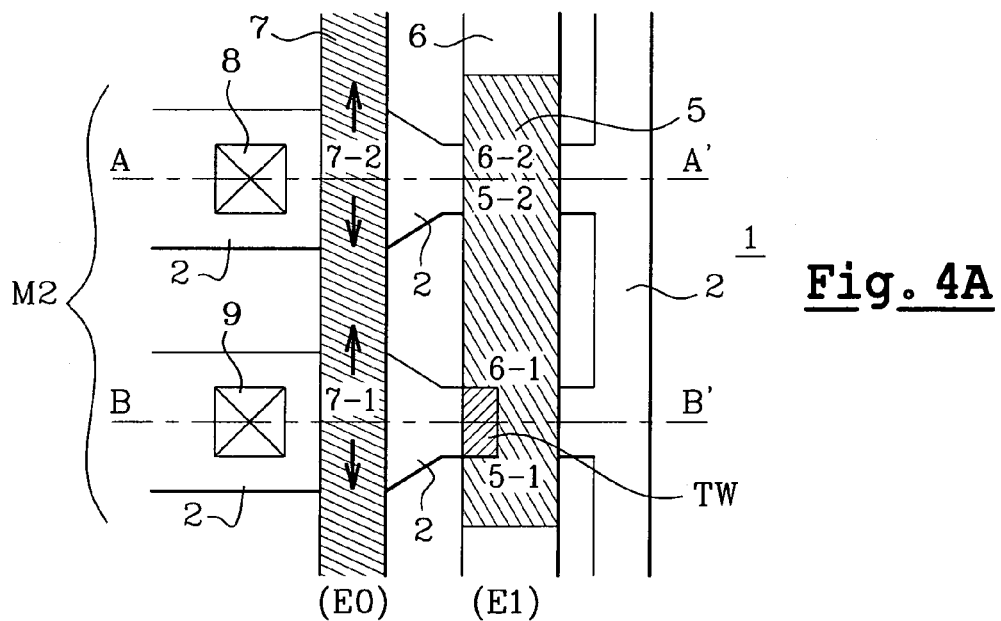
FIG. 4A represents the layout of a memory point, on the surface of a silicon substrate according to the present invention.
Figure 4C:
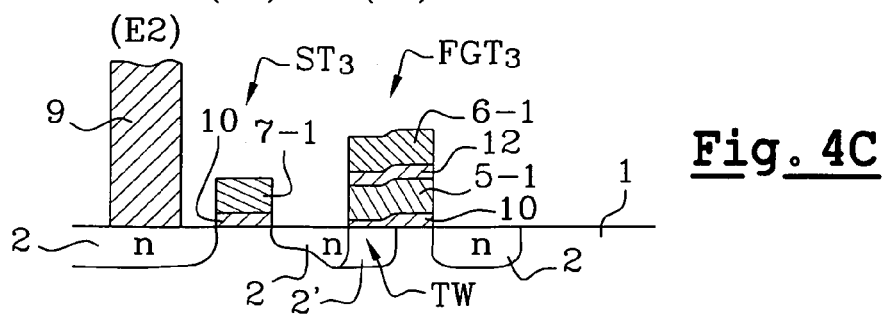
FIG. 4C is a cross-section of the memory point taken along axis BB' in FIG. 4A.

FIG. 4A shows the layout of the memory point M2 on the surface of a silicon substrate. FIG. 4B is a cross-section of the transistors ST4 and FGT4 according to an axis AA'. FIG. 4C is a cross-section of the transistors ST3 and FGT3 according to an axis BB'.

The following elements can be distinguished. The silicon substrate 1 is of the p-type. A line of polycrystalline silicon 5 is etched in the shape of a rectangle, forming both the floating gates 5-1, 5-2 of each of the transistors FGT3, FGT4 and a conductor path linking the two floating gates.

A line of polycrystalline silicon 6 covers the line 5 and forms both the control gates 6-1, 6-2 of the transistors FGT3, FGT4 and a conductor path inter-connecting these gates (leading to the gate control input E1). A line of polycrystalline silicon 7 forms both the gates 7-1, 7-2 of the transistors ST3, ST4 and a conductor path inter-connecting these gates (leading to the selection input E0).

There are n-type doped regions 2 implanted by self-alignment on the lines of polycrystalline silicon 6, 7, forming, on either side of such lines, drain and source regions of the transistors ST3, ST4, FGT3, FGT4. There are n-type doped regions 2' implanted by an implantation mask before the polycrystalline silicon is deposited, forming extensions of the regions 2 which extend beneath the floating gates.

A metal contact 8 is implanted in the drain region of the transistor ST4, forming the read input E3. A metal contact 9 is implanted in the drain region of the transistor. ST3, forming the program input E2.

A thick oxide layer 10 is interposed between the lines of polycrystalline silicon 5, 7 and the substrate 1 to form the gate oxide of the transistors ST3, ST4 and the floating-gate oxides of the transistors FGT3, FGT4. A tunnel oxide layer 11 is interposed between a small zone of the floating gate of the transistor FGT3 and the substrate 1, forming the tunnel window TW. A thick oxide layer 12 is interposed between the lines of polycrystalline silicon 5 and 6 to form the gate oxide separating the floating gates from the control gates of the transistors FGT3, FGT4.

The tunnel window of the transistor FGT3 thus corresponds to a tunnel oxide region in which the oxide layer between the floating gate and the silicon substrate is very thin (a few atomic layers) so as to enable the removal or the injection of charges into the floating gate by the tunnel effect. The tunnel window is obtained by etching a window in the thick oxide layer 10, then by growing on the substrate, the tunnel oxide layer 11. The tunnel oxide layer 11 is deposited in the window made in the thick oxide 10 to form the tunnel window, before the assembly is covered with the lines of polycrystalline silicon 5 and 6 (double poly technology).

Thus, the absence of a tunnel gate in the transistor FGT4 simply requires not etching the thick oxide layer 10 in the region intended to form the floating-gate oxide of this transistor before the tunnel oxide is grown. The etching resist of the thick oxide simply needs to be modified.

The drain-source short-circuit of the selection transistor ST4, proposed above, can also be obtained in a straightforward manner by implanting n-type dopants beneath the line of polycrystalline silicon 7, in a region 13 intended to form the channel of the transistor ST4. This doped region 13, which can be seen in FIG. 4B, links the drain and source regions 2. It is implanted before the line of polycrystalline silicon 7 is deposited, and at the same time as the regions 2' are implanted.

Finally, the implementation of the memory-point according to the present invention requires a straightforward modification of certain implantation masks or etching resists (compared to those used to manufacture classical EEPROM memory cells). Thus, memory points according to the present invention are easy to implant into an EEPROM memory area to form a non-volatile register, as will now be described.

Figure 5:
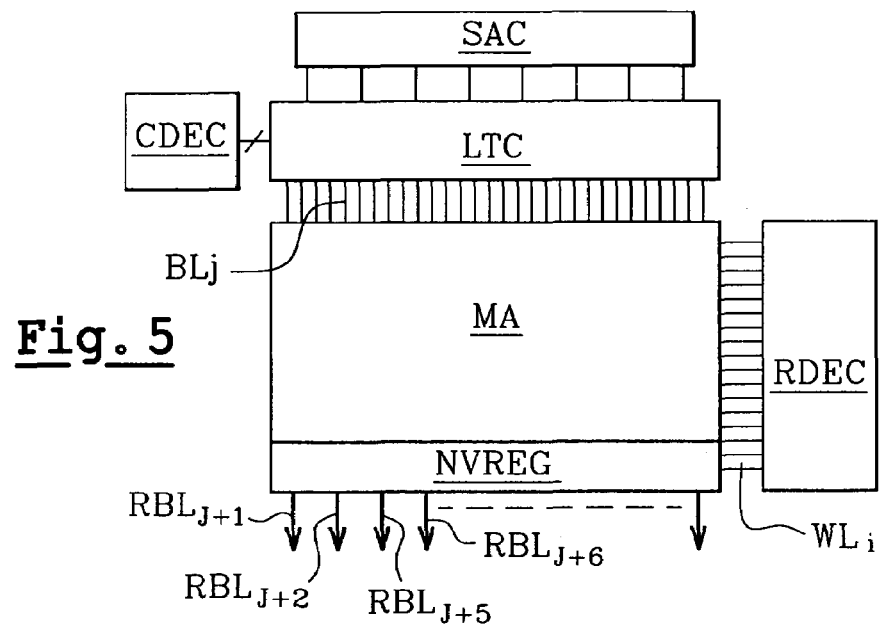
FIG. 5 schematically represents an EEPROM memory array comprising memory points according to the present invention.

FIG. 5 represents the general architecture of an EEPROM memory according to the present invention. A memory array MA, a line decoder RDEC, a column decoder CDEC, program latches LTC, and a read circuit SAC (sense amplifier circuit) can be distinguished. The memory array comprises bit lines BLj and word lines WLi, where i is a word line index and j is a bit line index.

At a determined location in the memory array MA, a memory area comprising one or more word lines is reserved for the manufacturing of memory cells according to the present invention, to produce a non-volatile register NVREG intended to receive special bits that are to be read when the integrated circuit is switched on or before it is activated (start signal). This area is preferably a vacant space located opposite the area for manufacturing the latches LTC and the circuit SAC, here the lower part of the memory array.

Special bit lines RBLj+1, RBLj+2, RBLj+5, RBLj+6 . . . ("Read Bit Lines) are extracted from this area which enable the memory cells according to the present invention to be read by specific read circuits.

Figure 6:
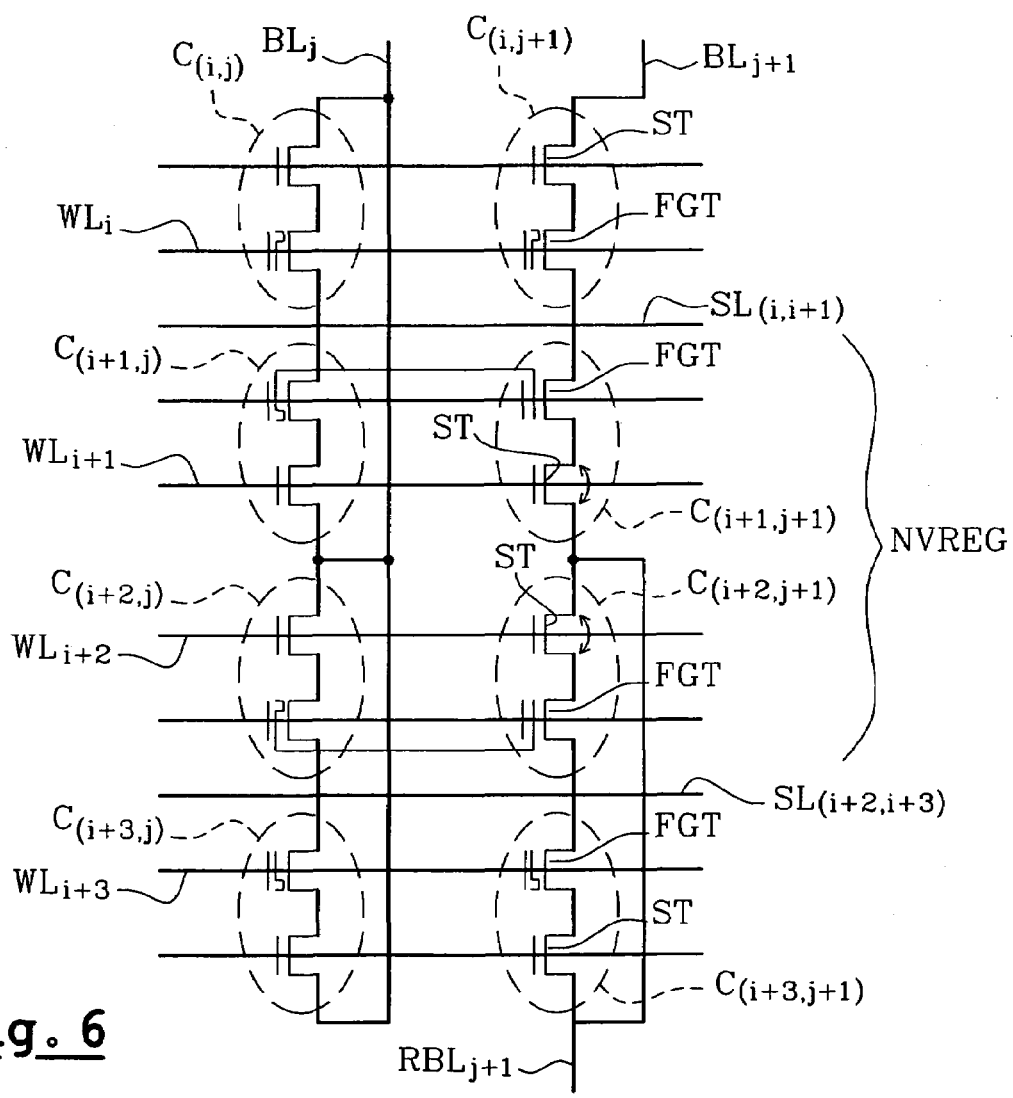
FIG. 6 is the wiring diagram of the area of the memory array receiving memory points according to the present invention.

FIG. 6 represents an example of an embodiment of the area forming the register NVREG. In this figure, the last four word lines of the memory array, referenced WLi, WLi+1, WLi+2, WLi+3 can be distinguished. For the sake of simplicity, only two bit lines BLj, BLj+1 are represented in the diagram.

The word line WLi comprises memory cells C(i, j), C(i, j+1), the word line WLi+1 comprises memory cells C(i+1, j), C(i+1, j+1), the word line WLi+2 comprises memory cells C(i+2, j), C(i+2, j+1) and the word line WLi+3 comprises memory cells C(i+3, j), C(i+3, j+1). Each memory cell comprises a floating-gate transistor FGT and a selection transistor ST.

The memory cells are arranged in symmetrical pairs. The memory cells belonging to two adjacent word lines WLi/ WLi+1, respectively WLi+2/WLi+3 are linked to a common source line, respectively SL(i, i+1), SL(i+2, i+3). The cells C(i, j), C(i, j+1) are normal cells, which means that they comprise floating-gate transistors FGT each having a tunnel window, and that they are each connected to a corresponding bit line of the memory array, respectively BLj, BLj+1.

The cell C(i+1, j) is a normal cell while the cell C(i+1, j+1) comprises a transistor FGT devoid of any tunnel window, and preferably, a selection transistor ST having its source and drain short-circuited. Together, these two cells form a memory point M2 according to the present invention. The cell C(i+1, j) is linked to the bit line BLj of the memory array, and is therefore erase and program accessible through the decoders RDEC and CDEC of the memory array. The cell C(i+1, j+1) is not connected to the bit line BLj+1 but is connected to a special bit line RBLj+1 which enables this cell to be connected to a specific read circuit, as described below.

The cell C(i+2, j) is a normal cell while the cell C(i+2, j+1) comprises a transistor FGT devoid of any tunnel window, and preferably, a selection transistor ST having its source and drain short-circuited. Together, the two cells C(i+2, j), C(i+2, j+1) also form a memory point M2 according to the present invention. The cell C(i+2, j) is linked to the bit line BLj of the memory array and is therefore erase and program accessible through the decoders RDEC and CDEC of the memory array. The cell C(i+2, j+1) is not connected to the bit line BLj+1 but is connected to the special bit line RBLj+1.

The cells C(i+3, j), C(i+3, j+1) are dummy cells that are not used. Due to the edge effects in the areas having a high density of components, it is common to provide, on the edge of such areas, components that are not used. These components often have defects.

Two word lines WLi+1, WLi+2 have thus been produced comprising alternately normal memory cells linked to bit lines of the memory array and memory cells without tunnel window linked to special bit lines. This forms in pairs, memory points according to the present invention. By using other bit lines of the memory array, it is possible, using the word lines WLi+1, WLi+2, to produce differential memory elements like the one represented in FIG. 7 or redundant differential memory elements like the one represented in FIG. 8.

Figure 7:
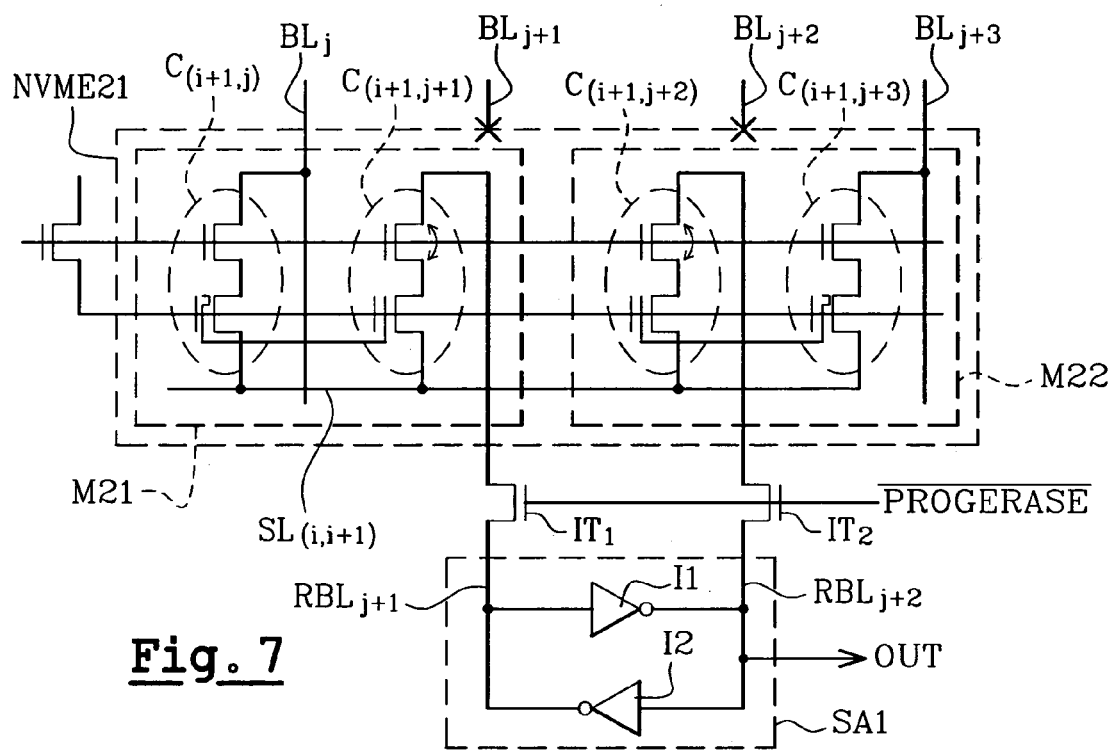
FIG. 7 is the wiring diagram of a first embodiment of a memory element according to the present invention.

The memory element NVME21 represented in FIG. 7 comprises two memory points M21, M22. The memory point M21 comprises the normal memory cell C(i+1, j), which is erasable and programmable via the decoders of the memory array, and the memory cell C(i+1, j+1) according to the present invention, which is linked to the special bit line RBLj+1. The memory point M22 comprises a memory cell C(i+1, j+2) according to the present invention and a normal memory cell C(i+1, j+3). The memory cell C(i+1, j+3) is linked to a bit line BLj+3 of the memory array, and is therefore erasable and programmable via the decoders of the memory array. The memory cell C(i+1, j+2) is linked to a special bit line RBLj+2.

The bit lines RBLj+1 and RBLj+2 are linked to the two inputs of a read circuit SA1 of the type described above (FIG. 1). The bit line RBLj+1 is connected to the input of the inverter gate I1, and the bit line RBLj+2 is connected to the input of the inverter gate I2.

If the selection transistors TS of the cells C(i+1, j+1), C(i+1, j+2) are short-circuited between their drains and their sources, these cells are read continuously by the circuit SA1. In this case, isolation transistors IT1, IT2 driven by a signal/PROGERASE are provided along the bit lines RBLj+1, RBLj+2. This signal changes to 0 during the erasing or the programming of the memory cells C(i+1, j), C(i+1, j+3) (which is done via the decoders of the memory array) and prevents these cells from being read during the injection or the removal of charges. At the moment the signal/PROGERASE changes to 0, the initial value read in the memory element NVME21 is maintained at the output OUT of the circuit SA1 by the two inverter gates I1, I2, which together form a latch.

Figure 8:
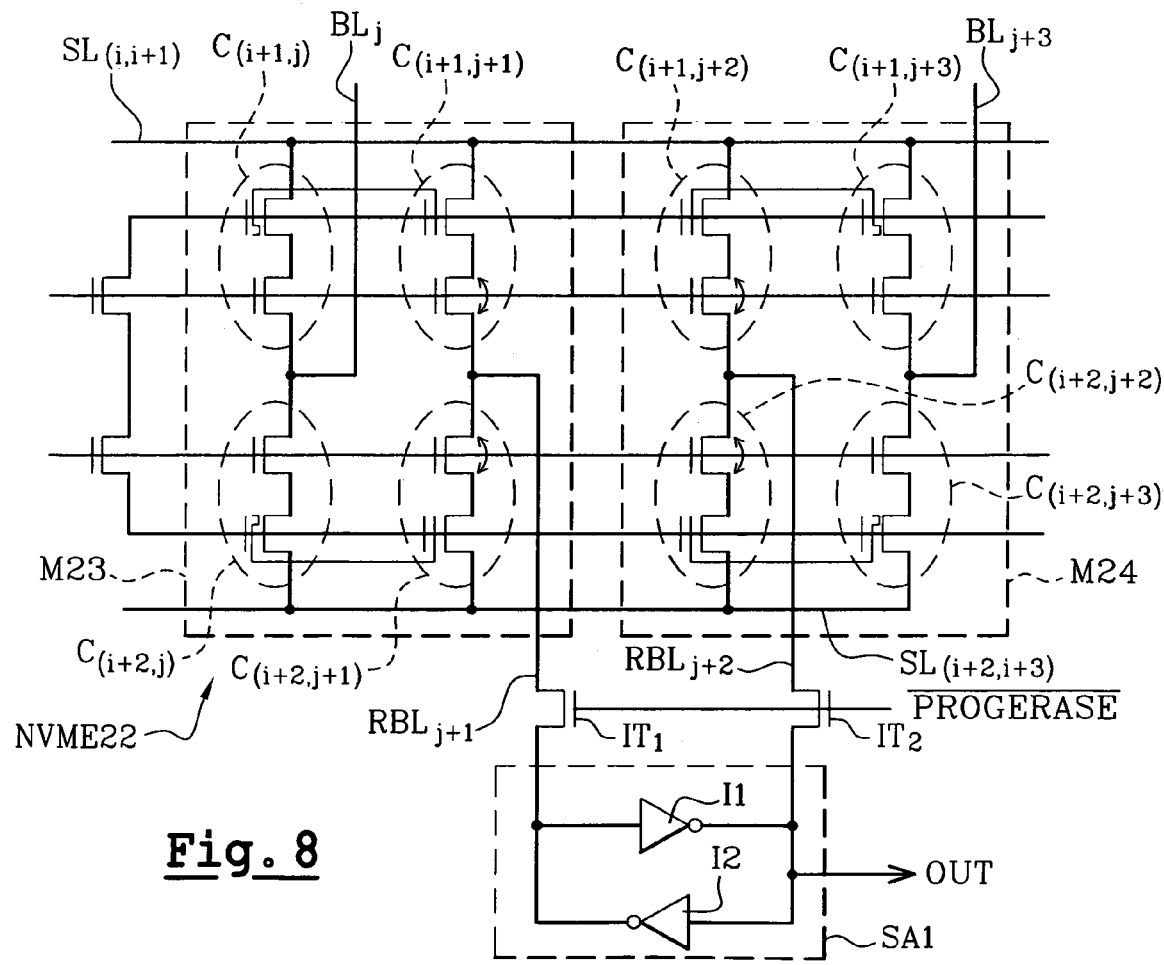
FIG. 8 is the wiring diagram of a second embodiment of a memory element according to the present invention.

The memory element NVME22 represented in FIG. 8 comprises two redundant structure memory points M23, M24. Each memory point comprises two pairs of memory cells of the memory array, as described in TABLE 2 below.

TABLE 2

| | NVME22 | | |
| --- | --- | --- | --- |
| M23 | | M24 | |
| C(i + 1, j) | C(i + 1, j + 1) (*) | C(i + 1, j + 2) (*) | C(i + 1, j + 3), |
| C(i + 2, j) | C(i + 2, j + 1) (*) | C(i + 2, j + 2) (*) | C(i + 2, j + 3) |
| connected to | connected to | connected to | connected to |
| BLj | RBLj + 1 | RBLj + 2 | BLj + 3 |

The cells C(i+1, j+1), C(i+2, j+1), C(i+1, j+2), C(i+2, j+2) (marked by "*" in TABLE 2) comprise floating-gate transistors without a tunnel window and are therefore intended to be read. Their selection transistors ST have drain-source short-circuits (marked by arrows in FIG. 8). The cells C(i+1, j+1), C(i+2, j+1) are connected to the special bit line RBLj+1 and the cells C(i+1, j+2), C(i+2, j+2) are connected to the special bit line RBLj+2. As above, these two bit lines are linked to the read circuit SA1 through the isolation transistors IT1, IT2 driven by the signal/PROGERASE. The pairs of redundant cells are read simultaneously, since the selection transistors of these cells are short-circuited. The advantages of the redundancy are obtained, in terms of storage security of the special bits, in the event that one of the memory cells is defective.

Figure 9:
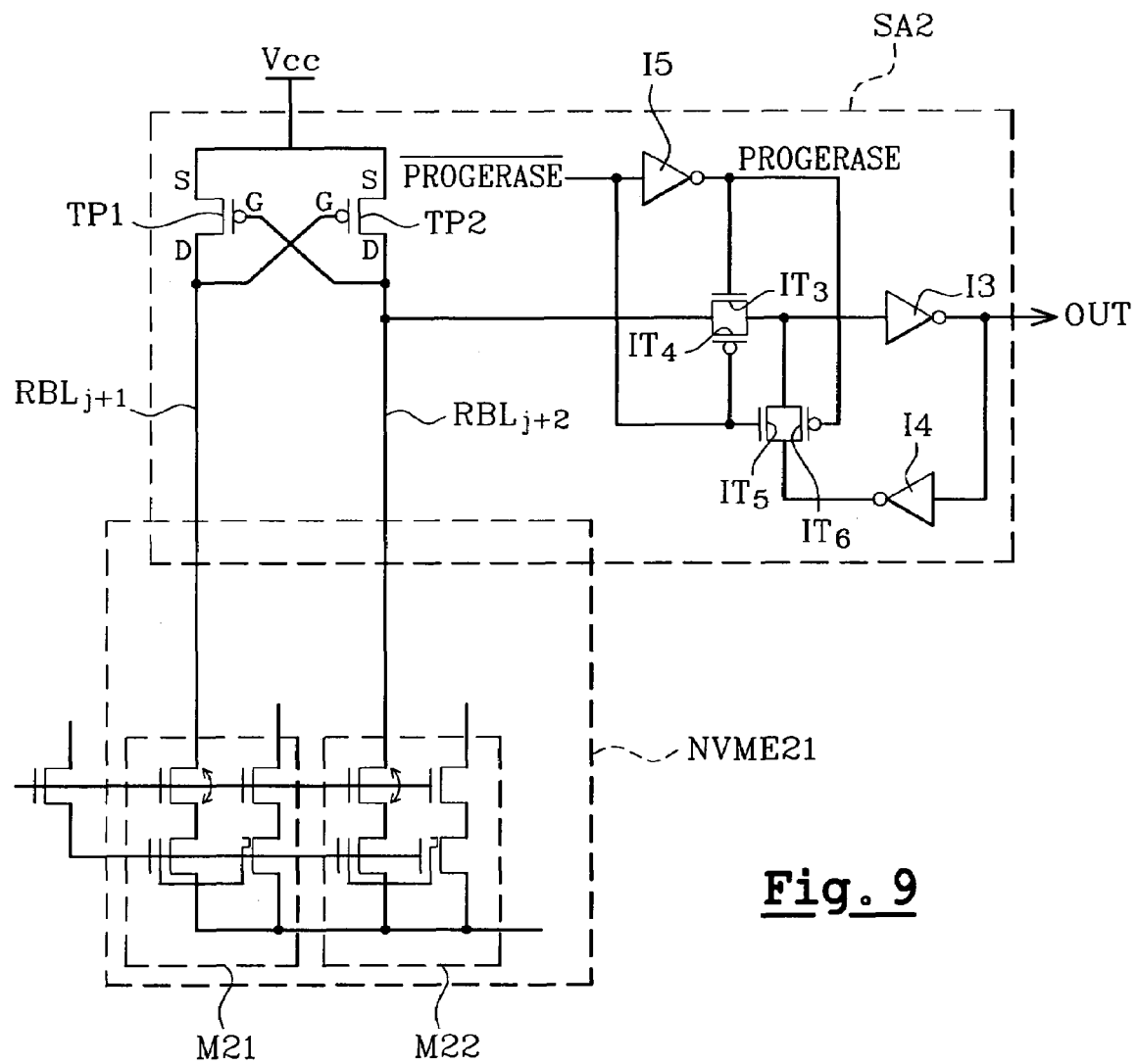
FIG. 9 is the wiring diagram of a third embodiment of a memory element according to the present invention.

FIG. 9 represents a read circuit SA2 according to the present invention, which can be used instead of the read circuit SA1. The circuit SA2 is connected to the memory element NVME21 (FIG. 7) but can also be used with the memory element NVME22 (FIG. 8) or any other memory element comprising memory points according to the present invention.

The circuit SA2 comprises two PMOS transistors TP1, . . . TP2. The transistor TP1 has its drain connected to the bit line RBLj+1 which is itself connected to the memory point M21. The transistor TP2 has its drain connected to the special bit line RBLj+2 which is itself connected to the memory point M22. Each transistor TP1, TP2 receives the voltage Vcc at its source. The gate of the transistor TP2 is connected to the drain of the transistor TP1, and the gate of the transistor TP1 is connected to the drain of the transistor TP2. The drain of the transistor TP2 (or, in one alternate embodiment, the drain of the transistor TP1) is connected to the input of an inverter gate I3 through an NMOS-type transistor IT3 and a PMOS-type transistor IT4. The transistors IT3 and IT4 are arranged in parallel. The output of the gate I3 forms the output OUT of the circuit SA2. The output of the gate I3 is applied to the input of an inverter gate I4. The output of the gate I4 is applied to the input of the gate I3 through an NMOS-type transistor IT5 and a PMOS-type transistor IT6. The transistors IT5 and IT6 are arranged in parallel. The transistors IT4, IT5 are driven by the signal/PROGERASE. The transistors IT3, IT6 are driven by a signal PROGERASE delivered by an inverter gate I5 receiving the signal/PROGERASE at input.

When the signal/PROGERASE is 1, the output OUT delivers a logic signal that is the opposite of the voltage present on the drain D of the transistor TP2. Thus, the drain D of the transistor TP2 changes to 0 (ground) and the output OUT changes to 1 when the memory point M22 is programmed and the memory point M21 is erased. Conversely, the drain D of the transistor TP2 changes to 1 (Vcc) and the output OUT changes to 0 when the memory point M22 is erased and the memory point M21 programmed. When the signal/PROGERASE is 0, i.e., during the periods of erasing programming the memory points M21, M22, the input of the gate I3 is isolated from the drain of the transistor TP2 and the output of the gate I3 is applied to the input of the gate I3 through the gate I4. In this case, the gates I3, I4 form a latch which maintains at the output OUT the data read in the memory element NVME21 before the start of the process of erasing and programming of the memory points M21, M22.

That which is claimed is:

1. An electrically erasable and programmable memory comprising:
    a substrate;
    a memory array comprising a plurality of normal memory cells arranged in rows and columns on said substrate;
    a plurality of normal bit lines coupled to the columns of said plurality of normal memory cells, and a plurality of word lines coupled to the rows of said plurality of normal memory cells;
    a row decoder on said substrate and coupled to said plurality of normal bit lines, and a column decoder on said substrate coupled to said plurality of word lines;
    a read circuit on said substrate and coupled to said memory array; and
    a non-volatile register on said substrate and integrated with said memory array, and comprising at least one memory point comprising
        at least one normal memory cell coupled to one of said plurality of normal bit lines and being erase and program accessible through said row and column decoders, said at least one normal memory cell comprising a floating-gate transistor comprising a floating gate and a tunnel window associated with said floating gate, and a selection transistor coupled to said floating-gate transistor,
        at least one special memory cell comprising a floating-gate transistor comprising a floating gate coupled to the floating gate of said at least one normal memory cell, said floating gate transistor being devoid of a tunnel window, and
        a special bit line coupled to said at least one special memory cell so that said at least one memory point can be read.

2. A memory according to claim 1, wherein each special memory cell further comprises a selection transistor coupled to said floating-gate transistor therein, said selection transistor comprising a source and a drain connected.

3. A memory according to claim 2, wherein said selection transistor comprises a doped region extending between the source and drain for providing the connection.

4. A memory according to claim 1, wherein said at least one memory point comprises a pair of memory points forming a memory element, and wherein said at least one special memory cell in each memory point is coupled to a respective special bit line.

5. A memory according to claim 1, wherein said at least one memory point comprises a pair of memory points, each memory point comprising a pair of normal memory cells and a pair of special memory cells, each special memory cell coupled to a respective special bit line, said pair of memory points forming a memory element of said non-volatile register that is program accessible through said row and column decoders and read accessible via said special bit lines without going through said row and column decoders.

6. A memory according to claim 4, wherein said memory array further comprises dummy memory cells adjacent an edge of said memory array, and wherein said pair of memory points are also adjacent the edge of said memory array.

7. A memory according to claims 4, further comprising a special read circuit on said substrate and coupled to the respective special bit lines for differentially reading said pair of memory points.

8. A memory according to claim 7, further comprising:
    an inhibit circuit for inhibiting said special read circuit during periods of erasing and programming of said pair of memory points; and
    a storage circuit for storing, during inhibiting of said special read circuit, data read in said pair of memory points.

9. A memory according to claim 8, wherein said inhibit circuit comprises a pair of isolation transistors; and wherein said special read circuit includes said storage circuit, said storage circuit comprising an inverter latch with two inputs, each input coupled to a respective memory point through a respective isolation transistor.

10. A memory according to claim 4, wherein said special read circuit comprises:
    two conducting branches, each conducting branch comprising a PMOS transistor comprising a drain coupled to a respective memory point;
    a first logic gate coupled to one of said conducting branches; and
    at least one second logic gate coupled to said first logic gate for forming a volatile-type latch during periods of erasing or programming said pair of memory points.

11. A memory comprising:
    a memory array comprising a plurality of normal memory cells arranged in rows and columns;
    a plurality of normal bit lines coupled to the columns of said plurality of normal memory cells, and a plurality of word lines coupled to the rows of said plurality of normal memory cells;
    a non-volatile register integrated with said memory array, and comprising at least one memory point comprising
        at least one normal memory cell coupled to one of said plurality of normal bit lines, said at least one normal memory cell comprising a floating-gate transistor comprising a floating gate and a tunnel window associated with said floating gate, and a selection transistor coupled to said floating-gate transistor, at least one special memory cell comprising a floating-gate transistor comprising a floating gate coupled to the floating gate of said at least one normal memory cell, said floating gate transistor being devoid of a tunnel window, and a special bit line coupled to said at least one special memory cell.

12. A memory according to claim 11, wherein each special memory cell further comprises a selection transistor coupled to said floating-gate transistor therein, said selection transistor comprising a source and a drain short-circuited together.

13. A memory according to claim 11, wherein said at least one memory point comprises a pair of memory points, and wherein said at least one special memory cell in each memory point is coupled to a respective special bit line.

14. A memory according to claim 11, wherein said at least one memory point comprises a pair of memory points, each memory point comprising a pair of normal memory cells and a pair of special memory cells, each special memory cell coupled to a respective special bit line, said pair of memory points forming a memory element of said non-volatile register that is accessible via the respective special bit lines.

15. A memory according to claim 13, wherein said memory array further comprises dummy memory cells adjacent an edge of said memory array, and wherein said pair of memory points are also adjacent the edge of said memory array.

16. A memory according to claims 13, further comprising a special read circuit coupled to the respective special bit lines for differentially reading said pair of memory points.

17. A memory according to claim 16, further comprising:
an inhibit circuit for inhibiting said special read circuit during periods of erasing and programming of said pair of memory points; and
a storage circuit for storing, during inhibiting of said special read circuit, data read in said pair of memory points.

18. A memory according to claim 17, wherein said inhibit circuit comprises a pair of isolation transistors; and wherein said special read circuit includes said storage circuit, said storage circuit comprising an inverter latch with two inputs, each input coupled to a respective memory point through a respective isolation transistor.

19. A memory according to claim 13, wherein said special read circuit comprises:
two conducting branches, each conducting branch comprising a PMOS transistor comprising a drain coupled to a respective memory point;
a first logic gate coupled to one of said conducting branches; and
at least one second logic gate coupled to said first logic gate for forming a volatile-type latch during periods of erasing or programming said pair of memory points.

20. A method for making a memory comprising:
forming a memory array comprising a plurality of normal memory cells arranged in rows and columns;

coupling a plurality of normal bit lines to the columns of the plurality of normal memory cells, and coupling a plurality of word lines to the rows of the plurality of normal memory cells;

coupling a row decoder to the plurality of normal bit lines, and coupling a column decoder to the plurality of word lines; and forming a non-volatile register with the memory array and comprising at least one memory point, the forming comprising forming at least one normal memory cell coupled to one of the plurality of normal bit lines and being erase and program accessible through the row and column decoders, the at least one normal memory cell comprising a floating-gate transistor comprising a floating gate and a tunnel window associated with the floating gate, and a selection transistor coupled to the floating-gate transistor, forming at least one special memory cell comprising a floating-gate transistor comprising a floating gate coupled to the floating gate of the at least one normal memory cell, the floating gate being devoid of a tunnel window, and coupling a special bit line to the at least one special memory cell so that the at least one memory point can be read without going through the row and column decoders.

21. A method according to claim 20, further comprising forming a selection transistor for each special memory cell, the selection transistor being coupled to the floating-gate transistor in the special memory cell, and comprising a source and a drain short-circuited together via a doped region extending therebetween.

22. A method according to claim 20, wherein forming the at least one memory point comprises forming a pair of memory points, and wherein the at least one special memory cell in each memory point is coupled to a respective special bit line, and the pair of memory points forming a memory element of the non-volatile register.

23. A method according to claim 20, wherein forming the at least one memory point comprises forming a pair of memory points, each memory point comprising a pair of normal memory cells and a pair of special memory cells coupled to a same respective special bit line, the pair of memory points forming a memory element of the non-volatile register.

24. A method according to claim 22, further comprising forming dummy memory cells adjacent an edge of the memory array, and wherein the pair of memory points are also formed adjacent the edge of the memory array.

* * * * *

UNITED STATES PATENT AND TRADEMARK OFFICE
CERTIFICATE OF CORRECTION

PATENT NO. : 7,139,195 B2
APPLICATION NO. : 11/067345
DATED : November 21, 2006
INVENTOR(S) : Rosa It is certified that error appears in the above-identified patent and that said Letters Patent is hereby corrected as shown below:

| | |
|---|---|
| Title Page, Section 56 | Insert -- FR 2831315 4/2003 -- |
| Column 8, Line 3 | Delete: "transistor. ST3"<br>Insert -- transistor ST3 -- |
| Column 8, Line 41 | Delete: "memory-point"<br>Insert -- memory point -- |
| Column 10, Line 64 | Delete: "TP1, …"<br>Insert -- TP1, -- |
| Column 12, Line 29 | Delete: "claims"<br>Insert -- claim -- |

Signed and Sealed this

Twenty-sixth Day of June, 2007

JON W. DUDAS
*Director of the United States Patent and Trademark Office*